United States Patent
Stockinger et al.

(10) Patent No.: US 10,164,426 B2
(45) Date of Patent: Dec. 25, 2018

(54) SENSING AND DETECTION OF ESD AND OTHER TRANSIENT OVERSTRESS EVENTS

(71) Applicant: FREESCALE SEMICONDUCTOR, INC., Austin, TX (US)

(72) Inventors: Michael A. Stockinger, Austin, TX (US); Gregory C. Edgington, Lakeway, TX (US); James R. Feddeler, Austin, TX (US); Xiang Li, Austin, TX (US); Richard W. Moseley, Austin, TX (US); Mihir Suchak, Morrisville, NC (US)

(73) Assignee: NXP USA, Inc., Austin, TX (US)

( * ) Notice: Subject to any disclaimer, the term of this patent is extended or adjusted under 35 U.S.C. 154(b) by 369 days.

(21) Appl. No.: 15/166,683

(22) Filed: May 27, 2016

(65) Prior Publication Data
US 2017/0346280 A1 Nov. 30, 2017

(51) Int. Cl.
*H02H 9/00* (2006.01)
*H02H 9/04* (2006.01)
*H02H 1/00* (2006.01)
*G01R 31/28* (2006.01)
*H01L 21/66* (2006.01)
(Continued)

(52) U.S. Cl.
CPC ......... *H02H 9/046* (2013.01); *G01R 31/2856* (2013.01); *H01L 22/34* (2013.01); *H02H 1/0007* (2013.01); *G01R 31/002* (2013.01); *G01R 31/2879* (2013.01); *H01L 27/0248* (2013.01)

(58) Field of Classification Search
USPC .......................................................... 361/56
See application file for complete search history.

(56) References Cited

U.S. PATENT DOCUMENTS 5,508,649 A * 4/1996 Shay .................. H03K 17/0822
327/143
6,819,539 B1 * 11/2004 Wright ...................... G06F 1/30
361/90

(Continued)

OTHER PUBLICATIONS

Ker et al., "New 4-Bit Transient-to-Digital Converter for System-Level ESD Protection in Display Panels," IEEE Transactions on Industrial Electronics, vol. 59, No. 2, Feb. 2012, pp. 1278-1287.

(Continued)

*Primary Examiner* — Ronald W Leja

(57) ABSTRACT

An integrated circuit includes an I/O pad and a protection device coupled to the I/O pad and a first supply node. A transient event detector includes a latch; a first transistor having a first current electrode coupled to the I/O pad, a control electrode coupled to a first supply node, and a second current electrode coupled to a data input of the latch, wherein the latch is configured to store an indication that a transient event occurred. An event level sensor includes a first transistor having a first current electrode coupled to the I/O pad, a control electrode coupled to the protection device, and a second current electrode coupled to a load circuit; a rectifier device coupled between the second current electrode and a capacitor; a second transistor having a control electrode coupled to the capacitor; and an output circuit configured to place a current on a first sense bus proportional to a current through the load circuit.

19 Claims, 8 Drawing Sheets

(51) Int. Cl.
  *G01R 31/00*  (2006.01)
  *H01L 27/02*  (2006.01)

(56) References Cited

U.S. PATENT DOCUMENTS

| | | | |
|---|---|---|---|
| 7,142,400 B1 * | 11/2006 | Williams | G06F 1/305 |
| | | | 361/18 |
| 7,675,723 B2 | 3/2010 | Ker et al. | |
| 2004/0109270 A1 * | 6/2004 | Stockinger | H01L 27/0251 |
| | | | 361/56 |
| 2008/0239599 A1 * | 10/2008 | Yizraeli | H02H 9/046 |
| | | | 361/56 |
| 2010/0188787 A1 * | 7/2010 | Karp | H01L 27/0266 |
| | | | 361/56 |
| 2010/0271742 A1 | 10/2010 | Shannon | |
| 2011/0235228 A1 * | 9/2011 | Salcedo | H02H 9/046 |
| | | | 361/111 |
| 2013/0132007 A1 | 5/2013 | Dunnihoo | |
| 2015/0280415 A1 | 10/2015 | Welty | |
| 2016/0209456 A1 * | 7/2016 | Dunnihoo | G01R 31/002 |
| 2017/0346280 A1 * | 11/2017 | Stockinger | H02H 1/0007 |

OTHER PUBLICATIONS

Ker et al., "On-Chip Transient Detection Circuit for System-Level ESD Protection in CMOS Integrated Circuits to Meet Electromagnetic Compatibility Regulation," IEEE Transactions on Electromagnetic Compatibility, vol. 50, No. 1, Feb. 2008, pp. 13-21.

Jack et al., "Voltage Monitor Circuit for ESD Diagnosis," Electrical Overstress/Electrostatic Discharge Symposium (EOS/ESD), 2011 33rd, Sep. 2011, 9 pages.

\* cited by examiner

FIG. 5

SENSING AND DETECTION OF ESD AND OTHER TRANSIENT OVERSTRESS EVENTS

BACKGROUND

Field

This invention relates in general to electrostatic discharge (ESD) and more specifically to ESD circuitry to detect the occurrence of and sense levels of ESD and other transient overstress events in an integrated circuit.

Description of the Related Art

An integrated circuit may be subjected to a damaging Electrostatic Discharge (ESD) event in the manufacturing process, during assembly and testing, or in the ultimate system application. In conventional integrated circuit (IC) ESD protection schemes, special clamp circuits are often used to shunt ESD current between the power supply rails and thereby protect internal elements from damage.

Immunity to ESD and other transient overstress events can be critical to many products incorporating integrated circuits. Determining the cause of ESD related errors requires specialized equipment and measurements that can be expensive and time consuming. In addition, the test equipment can change the transient behavior of a system, therefore it is difficult to determine the cause of the ESD event, which pins were affected, the amount of current through each pin, and the direction of the current, that is, whether the ESD event was positive (incoming) or negative (outgoing) relative to the IC.

BRIEF DESCRIPTION OF THE DRAWINGS

The present disclosure may be better understood, and its numerous objects, features, and advantages made apparent to those skilled in the art by referencing the accompanying drawings.

FIG. 5 is a diagram illustrating an example of registers that may be used in the IC device of FIG. 1 in accordance with at least one embodiment of the present disclosure.

The use of the same reference symbols in different drawings indicates identical items unless otherwise noted. The figures are not necessarily drawn to scale.

DETAILED DESCRIPTION

The following sets forth a detailed description of various embodiments intended to be illustrative of the invention and should not be taken to be limiting. In embodiments of devices and methods disclosed herein, on-die circuitry for detecting and sensing the level of transient or ESD stress events on a pin-by-pin basis are provided. The circuitry can identify I/O pins affected by an overstress event, indicate polarity (positive/negative or incoming/outgoing), as well as provide a measure of the severity of the event. ESD event level sensing and detection circuitry can be implemented among the I/O cells. The level sensing and detection cells can each include two detectors, one for positive and one for negative stress polarity. The level sensing circuitry for positive stress polarity can include a MOSFET whose output current is controlled by a voltage drop across an ESD diode, a circuit biasing the well of the MOSFET at the higher of the I/O pad or a supply voltage, a load device translating the MOSFET output current into a voltage signal, a diode and capacitor circuit detecting and storing the peak of the voltage signal, a reset device to discharge the capacitor and erase the stored peak voltage, and an output circuit (with current mirrors) translating the peak voltage back into a current signal. The event detection circuitry can include a detector MOSFET gated by the voltage drop across an ESD diode of the I/O cell, a well bias circuit for the MOSFET, a latching circuit whose input is driven by the detector MOSFET, an output signal indicating if a stress event has occurred, and a reset input to put the latching circuit into a pre-determined logic state. Pin location, polarity, and severity of the ESD event can be recorded in registers for subsequent use.

Figure 1:
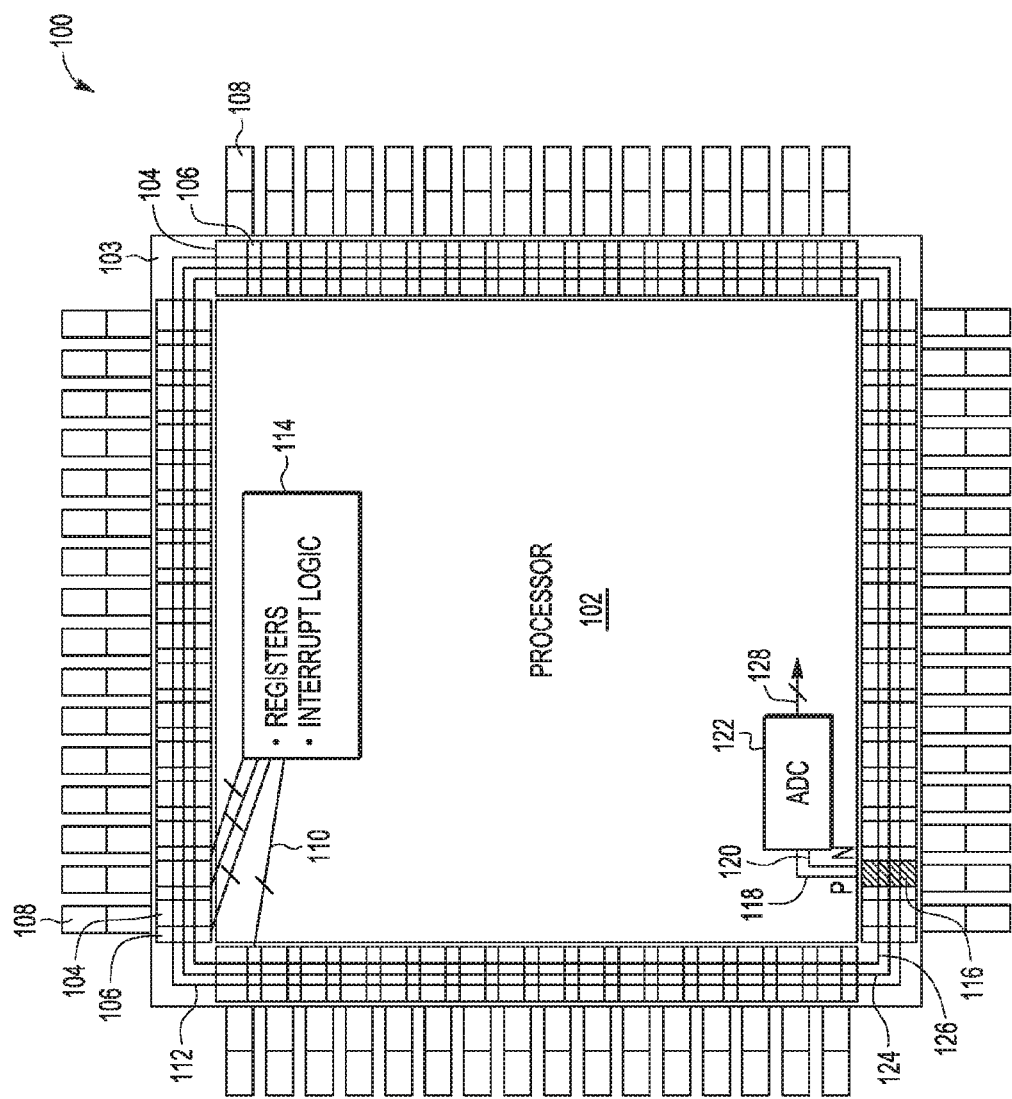
FIG. 1 illustrates a top view of an integrated circuit device with ESD event detect and level sensing in accordance with at least one embodiment of the present disclosure.
Figure 2:
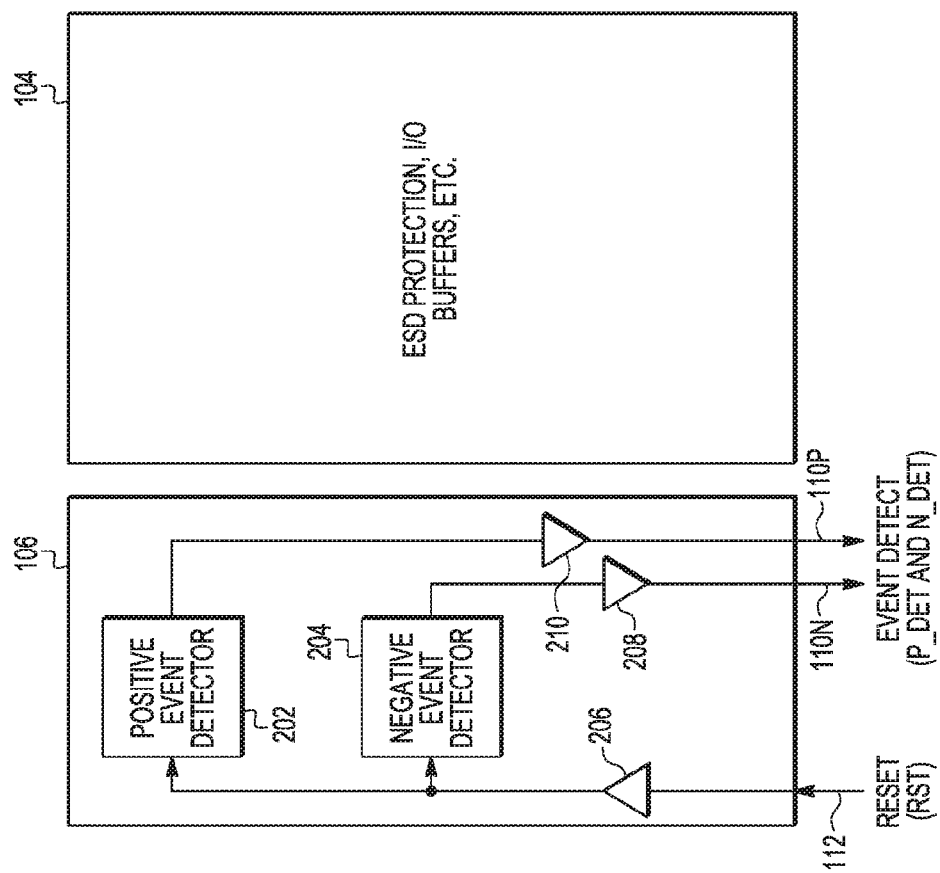
FIG. 2 illustrates a block diagram of an ESD event detect/level sense cell that may be used in the IC device of FIG. 1 in accordance with at least one embodiment of the present disclosure.

FIG. 1 illustrates a top view of an integrated circuit (IC) device 100 with ESD event level sensing and detection in accordance with selected embodiments of the present disclosure. In the illustrated example, the IC device 100 includes a core processor 102, input/output (I/O) cells 104, ESD event detect/level sense cells 106, and event level sense conversion cell formed or mounted on substrate 103. I/O cells 104, and ESD event detect/level sense cells 106 are implemented around the periphery of core processor 102 to receive signals from, and provide signals to, components external to the IC device 100 through electrically conductive I/O pads or pins 108. ESD event detect/level sense cells 106, ESD event level sensing cell 116, and at least some of the I/O cells 104 are connected to a first power domain, referred to as a VDDE bus or node and a VSS bus or node (not shown). Other I/O cells can be connected to separate power domains that use different voltages. As shown, each ESD event detect/level sense cell 106 is adjacent to a corresponding I/O cell 104. ESD event detect/level sense cells 106 are coupled to reset bus 112 and to positive and negative detect buses 110. As shown in FIG. 2, ESD event detect cells 106 each include positive and negative event detect circuits 202, 204 coupled to respective positive detect bus 110P and negative detect bus 110N (collectively referred to as "event detect bus 110"). Event detect bus 110 is coupled to ESD event registers and interrupt circuitry 114 in processor 102.

Figure 6:
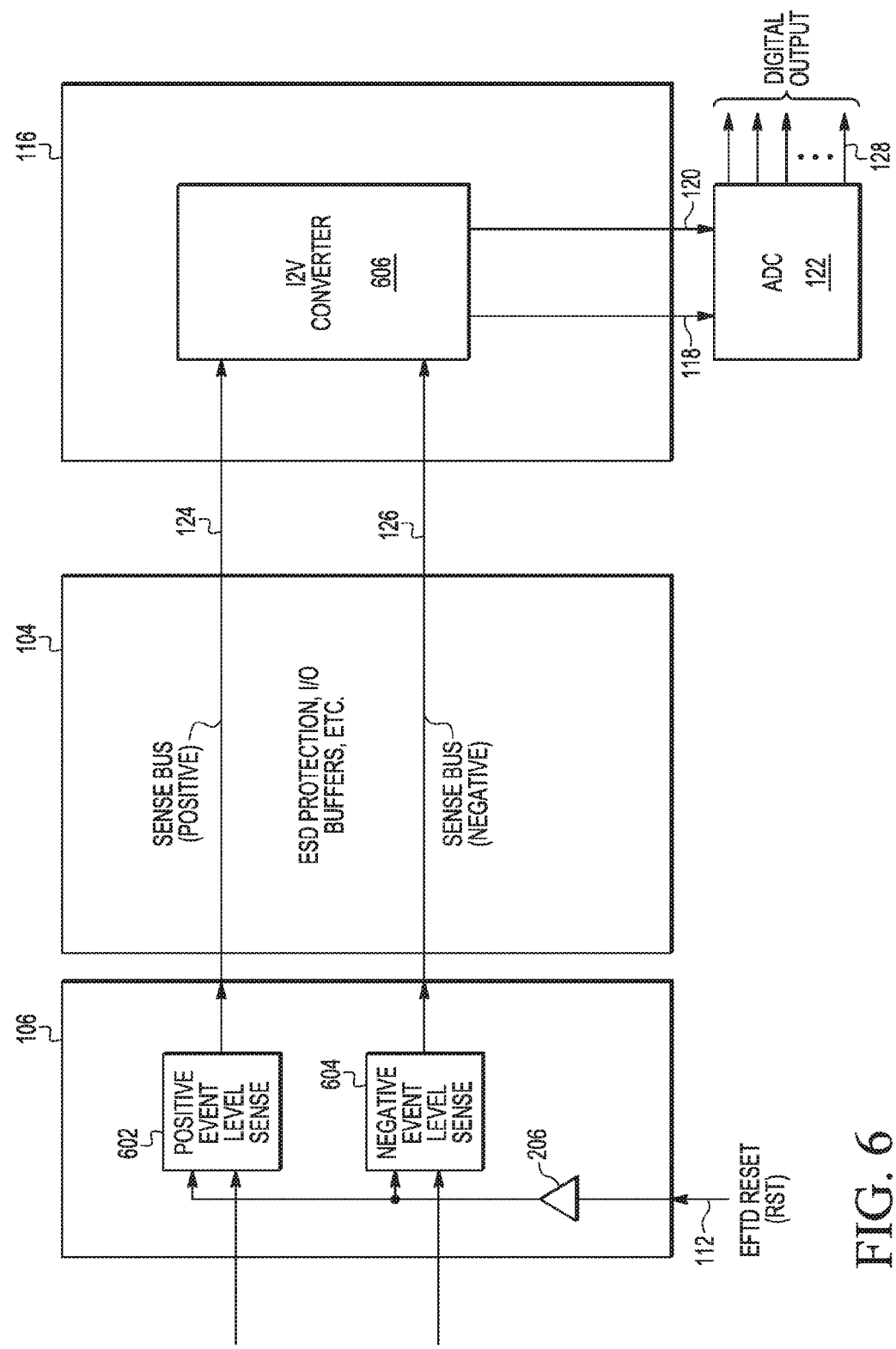
FIG. 6 illustrates a block diagram of additional components that may be included in the ESD event detect/level sense cell and current to voltage (I2V) converter used in the IC device of FIG. 1 in accordance with at least one embodiment of the present disclosure.

A single ESD event level sense conversion cell 116 is shown placed among ESD event detect/level sense cells 106 and I/O cells 104, as only one ESD event level sense conversion cell 116 is required to sense the level of the ESD event. ESD event level sense conversion cell 116 is coupled to ESD event detect cells 106 by positive sense current bus 124 and negative sense current bus 126, and to analog to digital converter (ADC) 122 by signals 118 and 120. As shown in FIG. 6, ESD event level sensing cell 106 includes positive and negative event level sense circuits 602, 604 coupled to respective positive sense current bus 124 and negative sense current bus 126. ADC 122 can be implemented as part of processor 102 or other suitable component. An output signal 128 from ADC 122 can be provided to ESD event registers and interrupt circuitry 114.

Processor 102 can be mounted on substrate 103 such as a leadframe or other chip carrier, with pads, leads or pins 108 coupled to communicate signals between processor 102 and one or more external devices. As such, pins 108 can be connected to another substrate such as a printed circuit board or other suitable substrate, along with other components external to IC device 100.

For purposes of discussion, the ESD detection and level sensing techniques of the present disclosure are illustrated in the context of a microprocessor. However, the ESD detection and level sensing techniques can be similarly employed in other types of electronic devices, such as application specific integrated circuits (ASICs), microcontrollers, systems-on-a-chip (SOCs), and the like.

The term "I/O," as used herein, refers to input, output, or a combination thereof. Accordingly, the term "I/O cell 104," as used herein, refers to any of an input-only cell, an output-only cell, or a cell configurable as both an input cell and an output cell.

Referring to FIGS. 1 and 2, FIG. 2 illustrates a block diagram of an ESD event detect/level sense cell 106 and I/O cell 104 that may be used in the IC device 100 of FIG. 1 in accordance with selected embodiments of the present disclosure. ESD event detect/level sense cell 106 includes positive and negative event detect circuits 202, 204 coupled to respective positive detect bus 110P and negative detect bus 110N. Transient detect reset bus 112 is coupled to positive and negative event detect circuits 202, 204. Level shifters 206, 208, 210 can be coupled to reset bus 112, negative event detector bus 110N, and positive event detector bus 110P to adjust the levels of the respective output and input signals between different power domains.

I/O cell 104 can include electrostatic discharge (ESD) protection circuitry, I/O buffers, and other circuitry or components to communicate signals with components external to processor 102. Positive event detector 202 is coupled to I/O cell 104 in order to detect current from an ESD or other transient overstress event flowing into I/O cell 104, and negative event detector 204 is coupled to I/O cell 104 in order to detect current from an ESD or other transient overstress event flowing out of I/O cell 104. Any suitable number of ESD event detect/level sense cells 106 can be included in IC device 100. If an ESD event detect/level sense cell 106 is coupled to each of a respective one of I/O cells 104, interrupt logic 114 initiates an interrupt routine or state machine that can determine the exact pins (and levels) where the ESD event occurred and make this information available to diagnostic or other suitable logic in processor 102 or other component.

Figure 3:
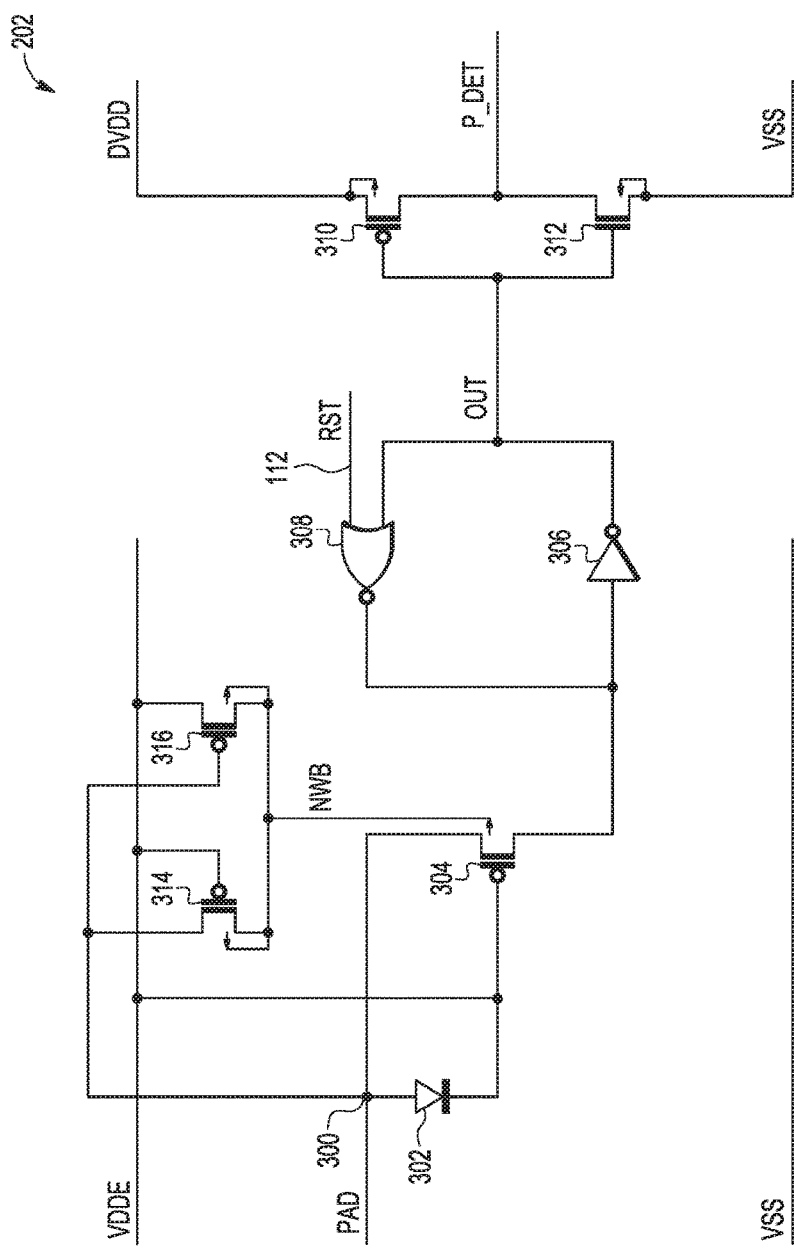
FIG. 3 illustrates a schematic diagram of a positive ESD event detector that may be used in the ESD event detect/level sense cell of FIG. 2 in accordance with at least one embodiment of the present disclosure.

FIG. 3 illustrates a schematic diagram of positive ESD event detector 202 that may be used in the ESD event detect/level sense cell 106 of FIG. 2 in accordance with at least one embodiment of the present disclosure. Positive ESD event detector 202 includes pad node 300 coupled to one terminal of ESD diode 302, first current electrode of P-channel transistor 314, gate electrode of P-channel transistor 316, and first current electrode of P-channel transistor 304. Diode 302 further includes a second terminal coupled to a gate electrode of P-channel transistor 304 and to supply voltage VDDE. P-channel transistor 304 is an ESD detection device that further includes a body tie coupled to the output of a well bias circuit that includes transistors 314 and 316. Second current electrodes and body ties of P-channel transistors 314 and 316 are coupled to one another and to the output of the well bias circuit. A gate electrode of transistor 314 and a first current electrode of transistor 316 are coupled to supply voltage VDDE.

A second current electrode of transistor 304 is coupled to an input of a latch circuit, which includes inverter 306 having an output coupled to a first input of NOR gate 308. A reset signal on reset bus 112 is coupled to a second input of NOR gate 308. An output of NOR gate 308 is coupled to the input of inverter 306 and the second current electrode of transistor 304. An output of latch circuit 306, 308 is coupled to a digital domain level shifter circuit, which also functions as an inverter that includes P-channel transistor 310 and N-channel transistor 312. P-channel transistor 310 includes a first current electrode coupled to digital domain supply voltage DVDD, a second current electrode coupled to a first current electrode of N-channel transistor 312, and a gate electrode coupled to the output of inverter 306. N-channel transistor 312 includes a first current electrode coupled to the second current electrode of P-channel transistor 310, a second current electrode coupled to source voltage VSS, which may be ground or other suitable voltage, and a gate electrode coupled to the output of inverter 306. The output of the level shifter is a detection signal P_DET provided at a node that couples the second current electrode of transistor 310 to the first current electrode of transistor 312.

During normal operation, before an ESD event occurs, detector transistor 304 is in a non-conductive state because the voltage at pad node 300 is at or below the VDDE voltage, therefore the source-gate voltage is not high enough to place transistor 304 in conductive mode. The input to inverter 306 is low, the output of inverter 306 is high, and the output of the inverter with transistors 310, 312 is low, indicating an ESD event has not been detected. The output of NOR gate 308 is low, which latches the input to inverter 306.

When an ESD event occurs with positive polarity at pad node 300, current flows through ESD diode 302 from pad node 300 to VDDE causing a voltage drop across the ESD diode 302 and elevating the voltage at pad node 300 above VDDE. Therefore, P-channel transistor 304 is placed in conductive mode due to positive voltage bias at the source electrode with respect to the gate electrode. This pulls the drain electrode of transistor 304 high, causing the input to inverter 306 to be high. The output of inverter 306 goes low and is input to level shifter/inverter 310/312. The output of level shifter/inverter 310/312 goes high, causing the positive ESD event detection signal (P_DET) to be asserted.

At the same time, the input to NOR gate 308 is low, and the output of NOR gate 308 is high since the RST signal is low. Thus, inverter 306 and NOR gate 308 latch the value of the input to inverter 306 even after the ESD event has ended. The positive ESD event detection signal remains high until the RST signal is asserted at the second input of NOR gate 308, causing the output of NOR gate and the input to inverter 306 to go low. The output of inverter 306 then goes high, and the positive ESD event detection signal goes low.

Well bias circuit including transistors 314, 316 is configured to couple the higher of supply voltage VDDE and voltage at pad node 300 to the well tie of transistor 304. Since the source/drain electrodes of transistor 304 are doped with P-type material, and the body or well is doped with N-type material, the well bias circuit prevents a source/drain to body diode of transistor 304 from turning on in parallel with ESD diode 302, which would create an additional bipolar P-N-P structure that would conduct current during a positive ESD event.

Figure 4:
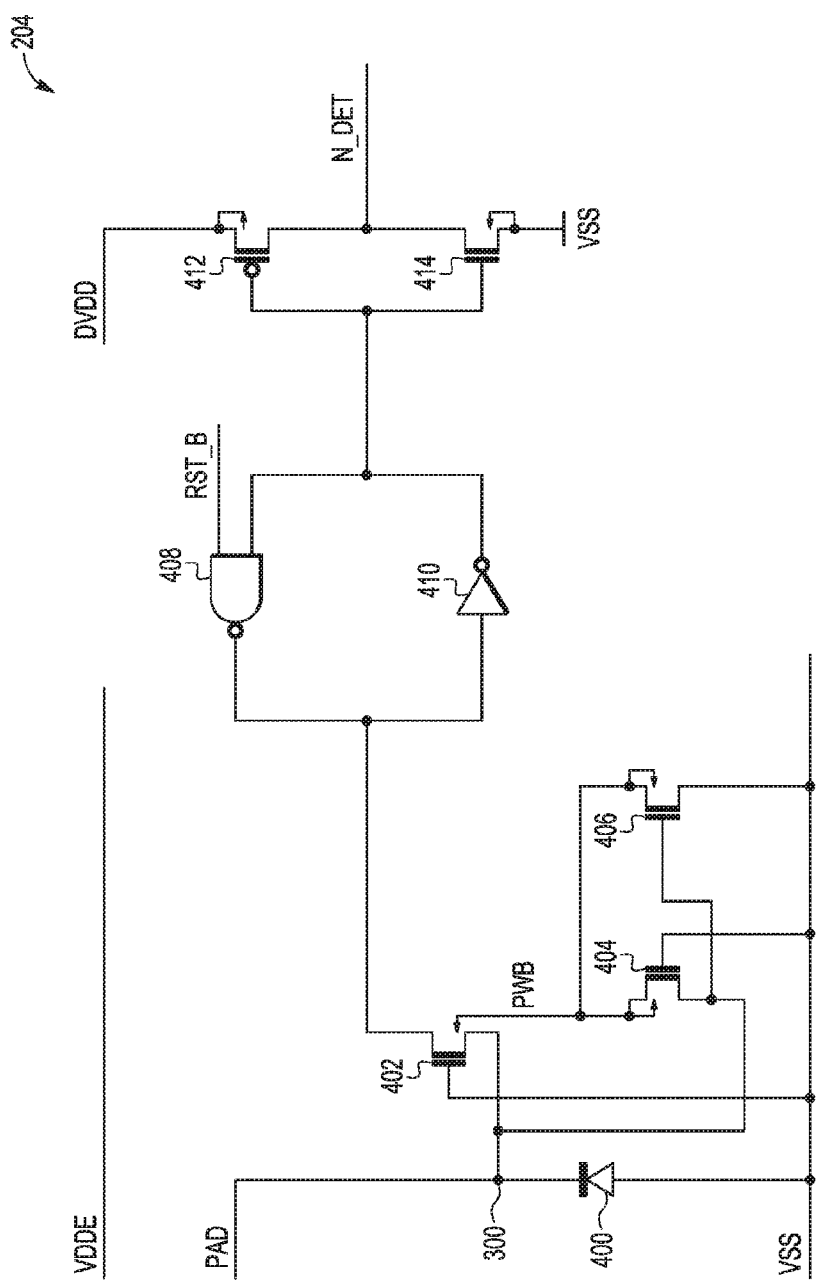
FIG. 4 illustrates a schematic diagram of a negative ESD event detector that may be used in the ESD event detect/level sense cell of FIG. 2 in accordance with at least one embodiment of the present disclosure.

FIG. 4 illustrates a schematic diagram of a negative ESD event detector 204 that may be used in the ESD event detect/level sense cell 106 of FIG. 2 in accordance with at least one embodiment of the present disclosure. Negative ESD event detector 204 includes pad node 300 coupled to one terminal of ESD diode 400, first current electrode of N-channel transistor 404, gate electrode of N-channel transistor 406, and first current electrode of N-channel transistor 402. Diode 400 further includes a second terminal coupled to supply voltage VSS. N-channel transistor 402 is an ESD detection device that further includes a body tie coupled to the output of a well bias circuit that includes transistors 404 and 406. Second current electrodes and body ties of N-channel transistors 404 and 406 are coupled to one another and to the output of the well bias circuit. A gate electrode of transistor 404 and a first current electrode of transistor 406 are coupled to supply voltage VSS.

A second current electrode of transistor 402 is coupled to an input of a latch circuit, which includes inverter 410 having an output coupled to a first input of NAND gate 408. A gate electrode of transistor 402 is coupled to supply voltage VSS. A complement or opposite (RST_B) of the reset signal (RST) is coupled to a second input to NAND gate 408. An output of NAND gate 408 is coupled to the input of inverter 410 and the second current electrode of transistor 402. An output of latch circuit 410, 408 is coupled to a digital domain level shifter circuit, which also functions as an inverter that includes P-channel transistor 412 and N-channel transistor 414. P-channel transistor 412 includes a first current electrode coupled to digital domain supply voltage DVDD, a second current electrode coupled to a first current electrode of N-channel transistor 414, and a gate electrode coupled to the output of inverter 410. N-channel transistor 414 includes a first current electrode coupled to the second current electrode of P-channel transistor 412, a second current electrode coupled to source voltage VSS, which may be ground or other suitable voltage, and a gate electrode coupled to the output of inverter 410. The output of the level shifter 412/414 is a detection signal (N_DET) provided at a node that is coupled to the second current electrode of transistor 412 and to the first current electrode of transistor 414.

During normal operation, before an ESD event occurs, detector transistor 402 is in a non-conductive state because the voltage at pad node 300 is at or above the VSS voltage, and the gate voltage is at supply voltage VSS, therefore the gate-source voltage is not high enough to place transistor 402 in conductive mode. The input to inverter 410 is high, the output of inverter 410 is low, and the output of inverter with transistors 412, 414 is high, indicating an ESD event has not been detected. The output of NAND gate 408 is high, which latches the input to inverter 410.

When an ESD event occurs with negative polarity at pad node 300, current flows through ESD diode 400 from VSS to pad node 300 causing a voltage drop across the ESD diode 400 and lowering the voltage at the pad node 300 below VSS. Therefore, N-channel transistor 402 is placed in conductive mode due to the negative voltage bias at the source electrode with respect to the gate electrode. This pulls the drain electrode of transistor 402 low, causing the input to inverter 410 to be low. The output of inverter 410 goes high and is input to level shifter/inverter 412/414. The output of level shifter/inverter 412/414 goes low, causing the negative ESD event detection signal to be low, which indicates and ESD event has occurred.

At the same time, the input to NAND gate 408 is high, and the output of NAND gate 408 is low since the RST_B signal is high. Thus, inverter 410 and NAND gate 408 latch the value of the input to inverter 410 even after the ESD event has ended. The negative ESD event detection signal remains low until the RST signal is asserted (RST_B becomes low) at the second input of NAND gate 408, causing the output of NAND gate 408 and the input to inverter 410 to go high. The output of inverter 410 then goes low, and the negative ESD event detection signal goes high, which indicates no ESD event has been detected. The negative ESD event detection signal may be inverted again so that a high value indicates detection of an ESD event, and a low value indicates no ESD event has been detected.

The well bias circuit including transistors 404, 406 is configured to couple the lower of supply voltage VSS and voltage at pad node 300 to the well tie of transistor 402. Since the source/drain electrodes of transistor 402 are doped with N-type material, and the body or well is doped with P-type material, the well bias circuit prevents a source/drain to body diode of transistor 402 from turning on in parallel with ESD diode 400, which would create an additional bipolar N-P-N structure that would conduct current during a negative ESD event.

Figure 5:
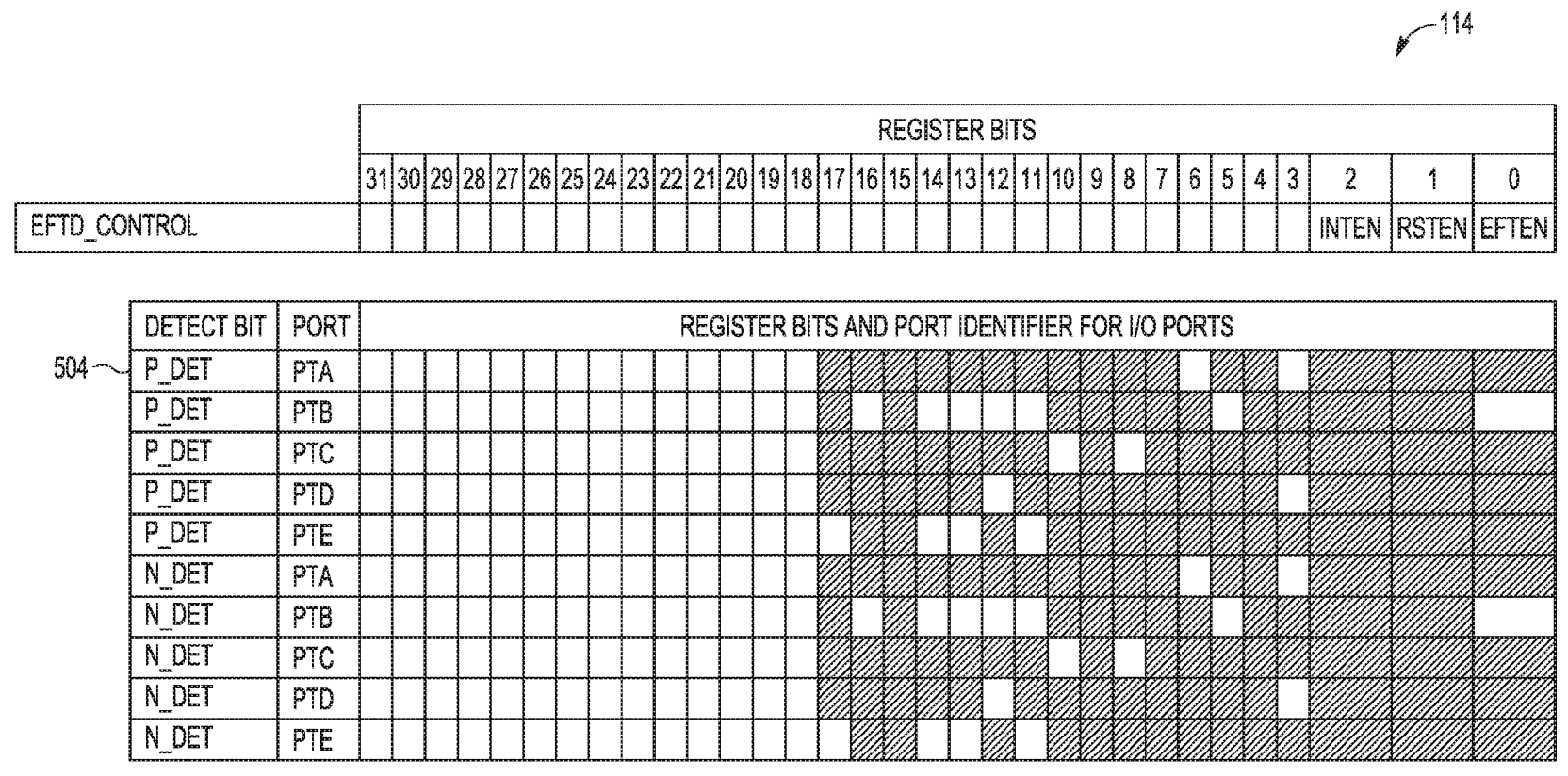

Referring to FIGS. 1 and 5, FIG. 5 is a diagram illustrating an example of a register 114 that may be used in the IC device 100 of FIG. 1 in accordance with selected embodiments of the present disclosure. Bits with hash marks indicate ports with an ESD event detect/level sense cell 106 instantiated. White cells indicate no ESD event detect/level sense cell 106. Register 114 includes a number of addressable entries 504, with each entry 504 corresponding to a particular I/O port. An I/O port may constitute a plurality of individual pins 108 assigned to a specific interface function of IC device 100. Each entry 504 includes a number of bits, and one bit corresponds to one of pins 108 associated with a particular I/O port. Additional bits in each entry 504 can be used to indicate whether interrupts are enabled (INTEN), reset is enabled (RSTEN) and electrical fast transient detection in enabled (EFTEN). Data is directly loaded into register 114 when an ESD event is captured by any of the positive or negative event detectors 202, 204. The ESD event detection signals P_DET and N_DET also trigger an interrupt signal indicating when an ESD event occurred on any of the pins 108. In one embodiment the interrupt signal can be implemented using a logic "OR" gate with multiple inputs, having each of the outputs of all positive or negative event detectors 202, 204 (with a logic "high" indicating the occurrence of an ESD event) coupled to an input of the logic "OR" gate. The data can be transferred to and stored in memory as long as desired, and can be, but does not need to be, cleared when an ESD event reset signal is asserted. Different entries 504 can be used for positive and negative ESD events. In the example shown in FIG. 5, there are 5 ports and eleven entries in register 114. Five of entries 504 (P_DET) are used to store ESD event detection data for positive ESD events, and five of entries 504 (N_DET) are used to store ESD event detection data for negative ESD events. Each entry 504 can include more bits than the number of pins associated with a port, depending on the addressing capability of processor 102. Other suitable configurations for register 114 for storing detection data can be used, with FIG. 5 showing just one example.

Referring to FIGS. 1 and 6, FIG. 6 illustrates a block diagram of additional components included in ESD event detect/level sense cell 106 that may be used in the IC device 100 of FIG. 1 along with ESD event level sense conversion cell 116 in accordance with at least one embodiment of the present disclosure. In addition to positive and negative event detectors 202, 204 (FIG. 2), ESD event detect/level sense cell 106 can include positive and negative ESD event level sense circuits 602, 604 coupled to respective positive sense bus 124 and negative sense bus 126. Reset bus 112 is coupled to positive and negative ESD event level sense circuits 602, 604. Level shifter 206 can be coupled to reset bus 112 to adjust the levels of the reset signal between different power domains.

Positive sense bus 124 and negative sense bus 126 are also coupled to a current to voltage (I2V) converter circuit 606 in ESD event level sensing cell 116. I2V converter circuit 606 is coupled to provide voltage signals representing the positive and negative ESD event level to ADC 122. The multi-bit digital output 128 of ADC 122 can be assigned to and written into additional entries 504 of register 114. The interrupt logic triggers a microprocessor interrupt. The interrupt code issues an ADC conversion command to allow processor 102 to hold off converting the value on the sense bus until the IC device 100 has stabilized after an ESD event. Processor 102 then reads the ADC data registers and stores the data at a specified memory location, for example in register 114 or in memory. The ADC conversion command may include a time delay in the ADC readout to ensure that the IC device has stabilized after an ESD event.

I/O cell 104 can include electrostatic discharge (ESD) protection circuitry, I/O buffers, and other circuitry or components to communicate signals with components external to processor 102. The purpose of positive ESD event level sense circuit 602 is to detect current from an ESD or other transient overstress event flowing into I/O cell 104, and the purpose of negative ESD event level sense circuit 604 is to detect current from an ESD or other transient overstress event flowing out of I/O cell 104. Typically, only one ESD event level sense conversion cell 116 is required, however, any suitable number of ESD event level sense conversion cells 116 can be included in IC device 100. Information regarding the sensed level of an ESD event can be provided from ADC 122 to registers 114 or other suitable component internal or external to processor 102.

Figure 7:
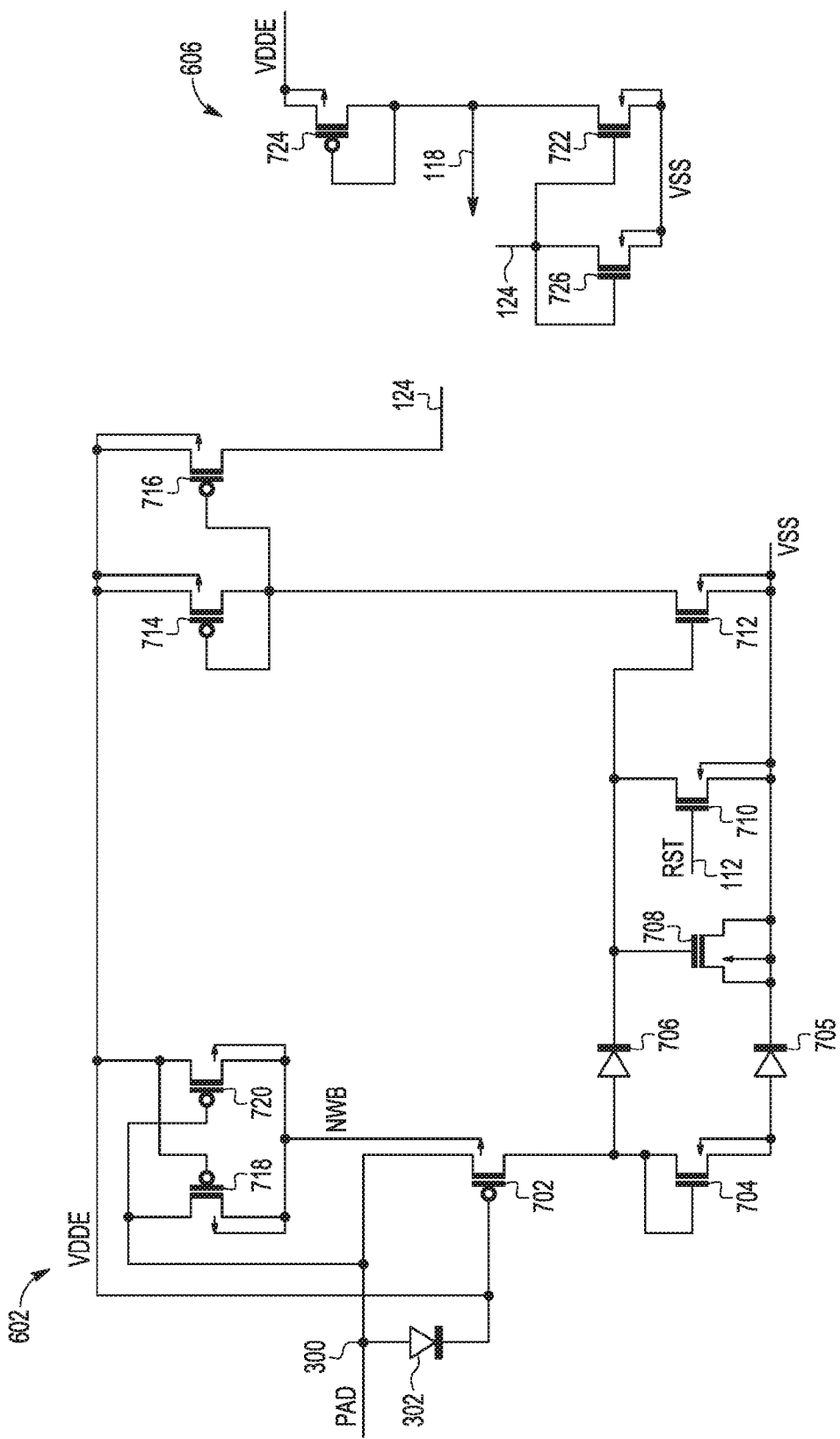
FIG. 7 illustrates a schematic diagram of a positive ESD event level sensor that may be used in the ESD event detect/level sense cell and in a positive I2V converter circuit of FIG. 6 in accordance with at least one embodiment of the present disclosure.

FIG. 7 illustrates a schematic diagram of a positive ESD event level sensor 602 that may be used in the ESD sensing cell 106 of FIG. 6 in accordance with at least one embodiment of the present disclosure. Positive ESD event level sensor 602 includes pad node 300 coupled to a first terminal of ESD diode 302, first current electrode of P-channel transistor 718, gate electrode of P-channel transistor 720, and first current electrode of P-channel transistor 702. Diode 302 further includes a second terminal coupled to a gate electrode of P-channel transistor 702 and to supply voltage VDDE. P-channel transistor 702 is an ESD detection device that further includes a body tie coupled to the output of a well bias circuit that includes transistors 718 and 720. Second current electrodes and body ties of P-channel transistors 718 and 720 are coupled to one another and form the output of a well bias circuit. A gate electrode of transistor 718 and a first current electrode of transistor 720 are coupled to supply voltage VDDE.

A second current electrode of transistor 702 is coupled to a first current electrode and a gate electrode of N-channel transistor 704, a first terminal of diode 706. A second terminal of diode 706 is coupled to a gate electrode of N-channel transistor 708, a first current electrode of N-channel transistor 710, and a gate electrode of N-channel transistor 712. Transistor 708 functions as a capacitor. A second terminal of transistor 704 is coupled to a first terminal of diode 705. A second supply voltage VSS is coupled to a second terminal of diode 705, first and second current electrodes of transistor 708, and second current electrodes of transistors 710, 712. A gate electrode of transistor 710 is coupled to ESD event reset bus 112 on which reset signal (RST) is provided.

An output driver circuit includes P-channel transistors 714, 716, each with first current electrodes coupled to supply voltage VDDE. Transistor 714 further includes a second current electrode coupled to gate electrodes of transistors 714 and 716, and a first current electrode of transistor 712. A second current electrode of transistor 716 provides a positive sense current signal that is provided on positive sense bus 124 to I2V converter circuit 606.

I2V converter circuit 606 includes N-channel transistors 726, 722, and P-channel transistor 724. N-channel transistor 726 has a gate electrode and first current electrode coupled to receive the positive sense current signal on positive sense bus 124. The positive sense current signal is also coupled to a gate electrode of N-channel transistor 722. Second current electrodes of transistors 726, 722 are coupled to one another and to supply voltage VSS. Transistor 724 includes a first current electrode coupled to supply voltage VDDE, and a gate electrode and second current electrode coupled to a first current electrode of transistor 722. An output signal tapped between the second current electrode of transistor 724 and the first current electrode of transistor 722 is a positive sense signal 118 in Volts.

During operation, when an ESD event occurs with positive polarity at pad node 300, current flows through ESD diode 302 from pad node 300 to VDDE causing a voltage drop across ESD diode 302 and elevating the voltage at pad node 300 above VDDE. Therefore, P-channel transistor 702 is placed in conductive mode due to positive voltage bias at the source electrode with respect to the gate electrode. The amount of current flowing through transistor 702 depends on the voltage drop across the ESD diode 302 and therefore on the level of ESD current flowing into pad node 300. Transistor 704 and diode 705 act as a pull-down or load device at the second current electrode of transistor 702. The current through transistor 702 and thus the voltage across load device 704, 705 is determined by the voltage drop across ESD diode 302 and therefore by the magnitude of ESD current flowing into pad node 300. When the voltage across the load device rises, diode 706 is placed in conducting mode, and transistor 708 is configured as a capacitor to store the peak voltage value at the second terminal of diode 706. Therefore the stored peak voltage represents a measure of the peak current of the ESD event even after the ESD event is over and diode 706 has turned off. Diode 705 adds an offset voltage to the first terminal of diode 706, thereby compensating for the voltage drop across diode 706 when charging the gate electrode of transistor 708. Effectively, the peak voltage drop across transistor 704 will be stored on transistor 708. Transistor 710 is a reset device that discharges transistor 708 when the reset signal (RST) is asserted.

The well bias circuit including transistors 718, 720 is configured to couple the higher of supply voltage VDDE and voltage at pad node 300 to the well tie of transistor 702. Since the source/drain electrodes of transistor 702 are doped with P-type material, and the body or well is doped with N-type material, the well bias circuit prevents a drain to body diode of transistor 702 from turning on in parallel with ESD diode 302, which would create an additional bipolar P-N-P structure that would conduct current during a positive ESD event. This additional P-N-P current would be superimposed on the regular MOSFET conduction current of transistor 702 and cause additional voltage drop on the load device 704, 705. Note that in other embodiments, the additional P-N-P current may be acceptable or even desirable.

When a positive voltage, representative of the peak current of the ESD event, is stored across the capacitor (708), the positive voltage provides gate-source bias to transistor 712 and makes transistor 712 conductive. The current through transistor 712 is therefore a function of the peak current of the ESD event. Current mirror with transistors 714 and 716 form an output circuit that translates the current through transistor 712 to a positive ESD event sense current signal on positive sense bus 124, which is coupled to I2V converter 606.

A current mirror with transistors 726, 722 in I2V converter 606 receives the positive ESD event sense current signal 124 and, along with load transistor 724, converts the positive ESD event sense current signal to a voltage that is provided to ADC 122. The ADC voltage is therefore a measure of the peak current of the ESD event. The positive ESD event sense current signal is approximately cumulative of current sensed on all pins on IC device 100 during a particular positive ESD event.

Figure 8:
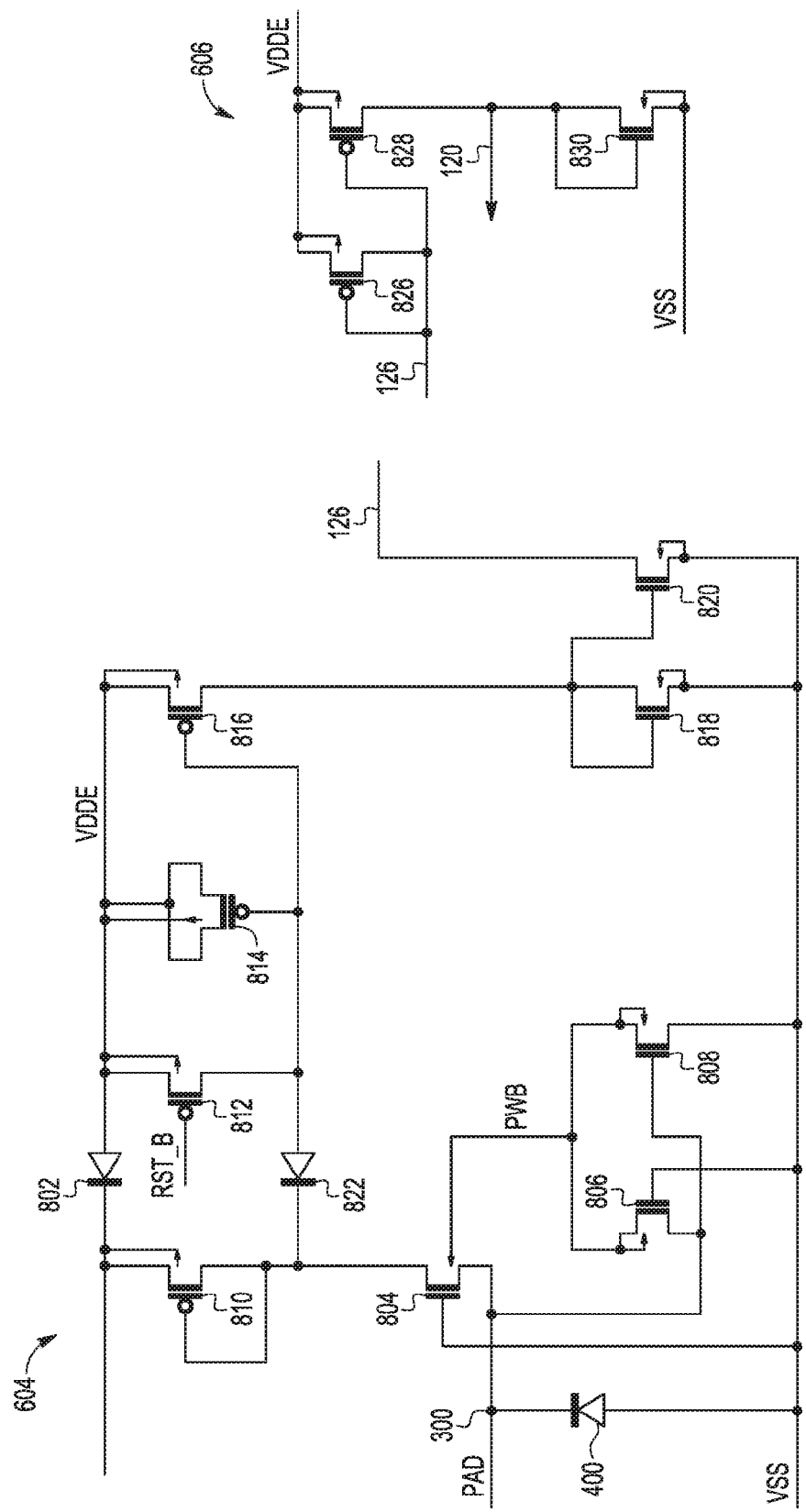
FIG. 8 illustrates a schematic diagram of a negative ESD event level sensor that may be used in the ESD event detect/level sense cell and in a negative I2V converter circuit of FIG. 6 in accordance with at least one embodiment of the present disclosure.

FIG. 8 illustrates a schematic diagram of a negative ESD event level sensor 604 that may be used in the ESD sensing cell 106 of FIG. 6 in accordance with at least one embodiment of the present disclosure. Negative ESD event level sensor 604 includes pad node 300 coupled to a first terminal of ESD diode 400, a first current electrode of N-channel transistor 806, gate electrode of N-channel transistor 808, and first current electrode of N-channel transistor 804. Diode 400 further includes a second terminal coupled to a gate electrode of N-channel transistor 804 and to supply voltage VSS. N-channel transistor 804 is an ESD detection device that further includes a body tie coupled to the output of a well bias circuit that includes transistors 806 and 808. A gate electrode of transistor 806 and a first current electrode of transistor 808 are coupled to supply voltage VSS. Second current electrodes and body ties of N-channel transistors 806 and 808 are coupled to one another and to the well of transistor 804.

A second current electrode of transistor 804 is coupled to a first current electrode and a gate electrode of P-channel transistor 810, and a first terminal of diode 822. A second terminal of diode 822 is coupled to a gate electrode of P-channel transistor 814, a first current electrode of P-channel transistor 812, and a gate electrode of P-channel transistor 816. Transistor 814 functions as a capacitor. A second terminal of transistor 810 is coupled to a first terminal of diode 802. A second supply voltage VDDE is coupled to a second terminal of diode 802, first and second current electrodes of transistor 814, and second current electrodes of transistors 812, 816. A gate electrode of transistor 812 is coupled to the complement or opposite ESD event reset signal (RST_B).

An output driver circuit includes N-channel transistors 818, 820, each with first current electrodes coupled to supply voltage VSS. Transistor 818 further includes a second current electrode coupled to gate electrodes of transistors 818 and 820, and a first current electrode of transistor 816. A second current electrode of transistor 820 provides a negative sense current signal that is provided on negative sense bus 126 to I2V converter circuit 606.

I2V converter circuit 606 includes P-channel transistors 826, 828, and N-channel transistor 830. P-channel transistor 826 has a gate electrode and first current electrode coupled to receive the negative sense current signal on negative sense bus 126. The negative sense current signal is also coupled to a gate electrode of P-channel transistor 828. Second current electrodes of transistors 826, 828 are coupled to one another and to supply voltage VDDE. Transistor 830 includes a first current electrode coupled to supply voltage VSS, and a gate electrode and second current electrode coupled to a first current electrode of transistor 828. An output signal tapped between the second current electrode of transistor 830 and the first current electrode of transistor 828 is a negative sense signal 120 in Volts.

During operation, when an ESD event occurs with negative polarity at pad node 300, current flows through ESD diode 400 from VSS to pad node 300 causing a voltage drop across the ESD diode 400 and lowering the voltage at the pad node 300 below VSS. Therefore, N-channel transistor 804 is placed in conductive mode due to negative voltage bias at the source electrode with respect to the gate electrode. The amount of current flowing through transistor 804 depends on the voltage drop across the ESD diode 400 and therefore on the level of ESD current flowing out of pad node 300. Transistor 810 and diode 802 act as a pull-up or load device at the second current electrode of transistor 804. The current through transistor 804 and thus the voltage across load device 810, 802 is determined by the voltage drop across ESD diode 400 and therefore by the magnitude of ESD current flowing out of pad node 300. When the voltage across the load device rises, diode 822 is placed in conducting mode, and transistor 814 is configured as a capacitor to store the peak voltage value at the second terminal of diode 822. Therefore the stored peak voltage represents a measure of the peak current of the negative ESD event even after the ESD event is over and diode 822 has turned off. Diode 802 adds an offset voltage to the first terminal of diode 822, thereby compensating for the voltage drop across diode 822 when charging the gate electrode of transistor 814. Effectively, the peak voltage drop across transistor 810 will be stored on transistor 814. Transistor 812 is a reset device that discharges transistor 814 when the reset signal RST is asserted.

The well bias circuit including transistors 806, 808 is configured to couple the lower of supply voltage VSS and voltage at pad node 300 to the well tie of transistor 804. Since the source/drain electrodes of transistor 804 are doped with N-type material, and the body or well is doped with P-type material, the well bias circuit prevents a drain to body diode of transistor 804 from turning on in parallel with ESD diode 400, which would create an additional bipolar N-P-N structure that would conduct current during a negative ESD event. This additional N-P-N current would be superimposed on the regular MOSFET conduction current of transistor 804 and cause additional voltage drop on the load device 810, 802. Note that in other embodiments of this invention, the additional N-P-N current may be acceptable or even desirable.

When a negative voltage, representative of the peak current of the ESD event, is stored at the gate terminal of the capacitor 814, the negative voltage provides gate-source bias to transistor 816 and makes transistor 816 conductive. The current through transistor 816 is therefore a function of the peak current of the ESD event. Current mirror with transistors 818 and 820 form an output circuit that translates the current through transistor 816 to a negative ESD event sense current signal on negative sense bus 126, which is coupled to I2V converter 606.

A current mirror with P-channel transistors 826, 828 in I2V converter 606 receives the negative ESD event sense current signal and, along with load transistor 830, converts the negative ESD event sense current signal to a voltage that is provided to ADC 122. The ADC voltage is therefore a measure of the peak current of the ESD event. The negative ESD event sense current signal is cumulative of current sensed on all pins on IC device 100 during a particular negative ESD event.

Note that additional ESD sensing cells 106 can be included in IC device 100, with switches or a multiplexer that can be operated to poll each ESD sensing cell 106 individually to determine the pin(s) 108 where the ESD event occurred.

By now it should be appreciated that in some embodiments, an integrated circuit can include an input/output (I/O) pad (104); and a transient event detector (202 or 204), having a latch (308/306 or 408/410); and a first transistor (304 or 402) having a first current electrode coupled to the I/O pad, a control electrode coupled to a first supply node, and a second current electrode coupled to a data input of the latch. The latch can be configured to store, in response to a transient event on the I/O pad, an indication that the transient event occurred.

In another aspect, the integrated circuit can further comprise a protection device (302 or 400) having a first terminal coupled to the I/O pad and a second terminal coupled to the first supply node (VDD or VSS)

In another aspect, the latch has a control input coupled to receive a reset signal (112).

In another aspect, the transient event detector is characterized as a positive transient event detector (202) in which the latch is configured to store, in response to a positive transient event on the I/O pad, an indication that the positive transient event occurred.

In another aspect, the integrated circuit can further comprise a negative transient event detector (204) having: a second latch (408/410), a second transistor (402) having a first current electrode coupled to the I/O pad, a control electrode coupled to a second supply node, and a second current electrode coupled to a data input of the second latch. The second latch can be configured to store, in response to a negative transient event on the I/O pad, an indication that the negative transient event occurred.

In another aspect, the transient event detector can comprise a well bias circuit (314/316 or 404/406) coupled to the I/O pad, the first supply node, and a well of the first transistor.

In another aspect, the well bias circuit can comprise a second transistor (316 or 406) having a first current electrode coupled to the first supply node, a gate electrode coupled to the I/O pad, and a second current electrode coupled to the well of the first transistor; and a third transistor (314 or 404) having a first current electrode coupled to the I/O pad, a gate electrode coupled to the first supply node, and a second current electrode coupled to the well of the first transistor.

In another aspect, the transient event detector further comprises a level shifter (310/312) coupled to the output of the latch and configured to provide a level shifted indication that the transient event occurred.

In another aspect, the integrated circuit can further comprise a plurality of I/O pads (104), wherein the plurality of I/O pads comprises the I/O pad, wherein each I/O pad of the plurality of I/O pads has a corresponding positive transient event detector configured to provide a first indication that a positive transient event occurred and corresponding negative transient event detector configured to provide a second indicator that a negative transient event occurred.

In other embodiments, an integrated circuit can include an input/output (I/O) pad (104); and an event level sensor (602 or 604), having: a protection device (302 or 400) having a first terminal coupled to the I/O pad and a second terminal coupled to a first supply node; a first transistor (702 or 804) having a first current electrode coupled to the I/O pad, a control electrode coupled to the second terminal of the protection device, and a second current electrode coupled to a load circuit (704, 705 or 810, 802); a rectifier device (also referred to as a "diode") (706 or 822) having a first terminal coupled to the second current electrode of the first transistor; a capacitor (708 or 814) coupled to a second terminal of the rectifier device; a second transistor (712 or 816) having a control electrode coupled to the capacitor; and an output circuit (714/716 or 818/820) coupled between a first current electrode of the second transistor and a first sense bus and configured to place a current on the first sense bus proportional to a current through the load circuit.

In another aspect, the capacitor can be configured to store a peak voltage at the second terminal of the rectifier device.

In another aspect, the second transistor can be configured to convert the peak voltage stored in the capacitor to a first current and wherein the current placed on the sense bus is proportional to the first current.

In another aspect, the integrated circuit can further comprise a plurality of I/O pads (104) and a plurality of event level sensors, wherein the plurality of I/O pads comprises the I/O pad and the plurality of event level sensors comprises the event level sensor, and wherein each of the plurality of event level sensors corresponds to a corresponding I/O pad of the plurality of I/O pads. Each of the plurality of event level sensors can comprise a corresponding protection device having a first terminal coupled to the corresponding I/O pad and a second terminal coupled to the first supply node; and a corresponding transistor having a first current electrode coupled to the corresponding I/O pad, a control electrode coupled to the second terminal of the corresponding protection device, and a second current electrode coupled to a corresponding load circuit. Each of the plurality of event level sensors can be coupled to the first sense bus and configured to place a corresponding current on the first sense bus proportional to a current through the corresponding load circuit.

In another aspect, each of the plurality of event level sensors can further comprise a corresponding rectifier device having a first terminal coupled to the second current electrode of the corresponding transistor; and a corresponding capacitor coupled to a second terminal of the corresponding rectifier device, wherein the corresponding capacitor is configured to store a corresponding peak voltage at the second terminal of the corresponding rectifier device.

In another aspect, the integrated circuit can further comprise a converter circuit (606) coupled to the first sense bus and configured to convert a cumulative current on the first sense bus from the plurality of event level sensors to an output voltage.

In another aspect, the integrated circuit can further comprise an analog to digital converter (ADC) (122) having an input coupled to receive the output voltage.

In another aspect, the event level sensor is characterized as a positive event level sensor (602), and the integrated circuit can further comprise a negative event level sensor (604), having: a second protection device (400) having a first terminal coupled to the I/O pad and a second terminal coupled to a second supply node; a third transistor (804) having a first current electrode coupled to the I/O pad, a control electrode coupled to the second terminal of the second protection device, and a second current electrode coupled to a second load circuit; a second rectifier device (822) having a first terminal coupled to the second current electrode of the third transistor; a second capacitor (814) coupled to a second terminal of the second rectifier device; a fourth transistor (816) having a control electrode coupled to the second capacitor; and a second output circuit (818/820) coupled between a first current electrode of the fourth transistor and a second sense bus and configured to place a second current on the second sense bus proportional to a current through the second load circuit.

In another aspect, the integrated circuit can further comprise a third transistor (710 or 812) having a first current electrode coupled to the capacitor and a control electrode coupled to receive a reset signal (RST or RST_B), wherein the capacitor is configured to be discharged by the third transistor in response to assertion of the reset signal.

In another aspect, the load circuit can comprise a third transistor (704 or 810) having a first current electrode, a gate electrode coupled to the first current electrode, and a second current electrode coupled to a first terminal of a diode (705 or 802), wherein a second terminal of the diode is coupled to a second supply node; and the output circuit comprises a current mirror (714/716 or 818/820) having an input coupled to the first current electrode of the second transistor and an output coupled to the first sense bus.

In another aspect, the integrated circuit can further comprise a well bias circuit coupled to the I/O pad, the first supply node, and a well of the first transistor (718/720 or 806/808).

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Some of the above embodiments, as applicable, may be implemented using a variety of different information processing systems. Of course, the description of the architecture has been simplified for purposes of discussion, and it is just one of many different types of appropriate architectures that may be used in accordance with the disclosure. Those skilled in the art will recognize that the boundaries between logic blocks are merely illustrative and that alternative embodiments may merge logic blocks or circuit elements or impose an alternate decomposition of functionality upon various logic blocks or circuit elements.

Further, although the circuit implementations disclosed herein are illustrated using metal oxide semiconductor (MOS) transistors, such as silicon substrate and silicon on insulator MOS field effect transistors (MOSFETs), other transistor types, such as bipolar junction transistors, Multiple Independent Gate FETs (MIGFETs) and other materials, such as silicon germanium, can be implemented as appropriate without departing from the scope of the present disclosure. The term "transistor," as used herein, refers to a single transistor or an array of transistors, wherein the single transistor or some or all of the transistors of an array of transistors can be implemented as a single-segment transistor or as a transistor comprising a plurality of segments (or "fingers").

Although the disclosure is described herein with reference to specific embodiments, various modifications and changes can be made without departing from the scope of the present disclosure as set forth in the claims below. For example, although ESD events have been used as an example of a transient stress event herein, the devices and methods disclosed herein can also be used to protect IC devices for other types of transient stress events. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit, comprising:
an input/output (I/O) pad; and
a transient event detector, having:
a latch; and
a first transistor having a first current electrode coupled to the I/O pad, a control electrode coupled to a first supply node, and a second current electrode coupled to a data input of the latch, a well bias circuit coupled to the I/O pad, the first supply node, and a well of the first transistor,
wherein the latch is configured to store, in response to a transient event on the I/O pad, an indication that the transient event occurred.

2. The integrated circuit of claim 1, further comprising:
a protection device having a first terminal coupled to the I/O pad and a second terminal coupled to the first supply node.

3. The integrated circuit of claim 1, wherein the latch has a control input coupled to receive a reset signal.

4. The integrated circuit of claim 1, wherein the transient event detector is characterized as a positive transient event detector in which the latch is configured to store, in response to a positive transient event on the I/O pad, an indication that the positive transient event occurred.

5. The integrated circuit of claim 4, wherein the integrated circuit further comprises a negative transient event detector having:
a second latch;
a second transistor having a first current electrode coupled to the I/O pad, a control electrode coupled to a second supply node, and a second current electrode coupled to a data input of the second latch,
wherein the second latch is configured to store, in response to a negative transient event on the I/O pad, an indication that the negative transient event occurred.

6. The integrated circuit of claim 1, wherein the well bias circuit comprises:
a second transistor having a first current electrode coupled to the first supply node, a gate electrode coupled to the I/O pad, and a second current electrode coupled to the well of the first transistor; and
a third transistor having a first current electrode coupled to the I/O pad, a gate electrode coupled to the first supply node, and a second current electrode coupled to the well of the first transistor.

7. The integrated circuit of claim 1, wherein the transient event detector further comprises a level shifter coupled to the output of the latch and configured to provide a level shifted indication that the transient event occurred.

8. The integrated circuit of claim 1, further comprising:
a plurality of I/O pads, wherein the plurality of I/O pads comprises the I/O pad, wherein each I/O pad of the plurality of I/O pads has a corresponding positive transient event detector configured to provide a first indication that a positive transient event occurred and corresponding negative transient event detector configured to provide a second indicator that a negative transient event occurred.

9. An integrated circuit, comprising:
an input/output (I/O) pad; and
an event level sensor, having:
a protection device having a first terminal coupled to the I/O pad and a second terminal coupled to a first supply node;
a first transistor having a first current electrode coupled to the I/O pad, a control electrode coupled to the second terminal of the protection device, and a second current electrode coupled to a load circuit;
a rectifier device having a first terminal coupled to the second current electrode of the first transistor;
a capacitor coupled to a second terminal of the rectifier device;
a second transistor having a control electrode coupled to the capacitor; and
an output circuit coupled between a first current electrode of the second transistor and a first sense bus and configured to place a current on the first sense bus proportional to a current through the load circuit.

10. The integrated circuit of claim 9, wherein the capacitor is configured to store a peak voltage at the second terminal of the rectifier device.

11. The integrated circuit of claim 10, wherein the second transistor is configured to convert the peak voltage stored in the capacitor to a first current and wherein the current placed on the sense bus is proportional to the first current.

12. The integrated circuit of claim 9, comprising a plurality of I/O pads and a plurality of event level sensors, wherein the plurality of I/O pads comprises the I/O pad and the plurality of event level sensors comprises the event level sensor, and wherein each of the plurality of event level sensors corresponds to a corresponding I/O pad of the plurality of I/O pads, wherein each of the plurality of event level sensors comprises:
a corresponding protection device having a first terminal coupled to the corresponding I/O pad and a second terminal coupled to the first supply node; and
a corresponding transistor having a first current electrode coupled to the corresponding I/O pad, a control electrode coupled to the second terminal of the corresponding protection device, and a second current electrode coupled to a corresponding load circuit,
wherein each of the plurality of event level sensors is coupled to the first sense bus and configured to place a corresponding current on the first sense bus proportional to a current through the corresponding load circuit.

13. The integrated circuit of claim 12, wherein each of the plurality of event level sensors further comprises:
a corresponding rectifier device having a first terminal coupled to the second current electrode of the corresponding transistor;
a corresponding capacitor coupled to a second terminal of the corresponding rectifier device, wherein the corresponding capacitor is configured to store a corresponding peak voltage at the second terminal of the corresponding rectifier device.

14. The integrated circuit of claim 13, further comprising:
a converter circuit coupled to the first sense bus and configured to convert a cumulative current on the first sense bus from the plurality of event level sensors to an output voltage.

15. The integrated circuit of claim 14, further comprising:
an analog to digital converter (ADC) having an input coupled to receive the output voltage.

16. The integrated circuit of claim 15, wherein the event level sensor is characterized as a positive event level sensor, and the integrated circuit further comprises a negative event level sensor, having:
a second protection device having a first terminal coupled to the I/O pad and a second terminal coupled to a second supply node;
a third transistor having a first current electrode coupled to the I/O pad, a control electrode coupled to the second terminal of the second protection device, and a second current electrode coupled to a second load circuit;
a second rectifier device having a first terminal coupled to the second current electrode of the third transistor;
a second capacitor coupled to a second terminal of the second rectifier device;
a fourth transistor having a control electrode coupled to the second capacitor; and a second output circuit coupled between a first current electrode of the fourth transistor and a second sense bus and configured to place a second current on the second sense bus proportional to a current through the second load circuit.

17. The integrated circuit of claim 9, further comprising a third transistor having a first current electrode coupled to the capacitor and a control electrode coupled to receive a reset signal, wherein the capacitor is configured to be discharged by the third transistor in response to assertion of the reset signal.

18. The integrated circuit of claim 9, wherein:
the load circuit comprises a third transistor having a first current electrode, a gate electrode coupled to the first current electrode, and a second current electrode coupled to a second supply node through a second rectifier device; and
the output circuit comprises a current mirror having an input coupled to the first current electrode of the second transistor and an output coupled to the first sense bus.

19. The integrated circuit of claim 9, further comprising:
a well bias circuit coupled to the I/O pad, the first supply node, and a well of the first transistor.

* * * * *